(12) United States Patent
Tiemeijer et al.

(10) Patent No.: US 7,915,584 B2
(45) Date of Patent: Mar. 29, 2011

(54) TEM WITH ABERRATION CORRECTOR AND PHASE PLATE

(75) Inventors: Peter Christiaan Tiemeijer, Eindhoven (NL); Alan Frank De Jong, Eindhoven (NL)

(73) Assignee: FEI Company, Hillsboro, OR (US)

( * ) Notice: Subject to any disclaimer, the term of this patent is extended or adjusted under 35 U.S.C. 154(b) by 302 days.

(21) Appl. No.: 12/370,542

(22) Filed: Feb. 12, 2009

(65) Prior Publication Data

US 2009/0200464 A1   Aug. 13, 2009

(30) Foreign Application Priority Data

Feb. 13, 2008  (EP) ..................... 08151369

(51) Int. Cl.
  *G01N 23/04* (2006.01)
  *H01J 37/26* (2006.01)
  *H01J 37/04* (2006.01)
(52) U.S. Cl. ............... 250/310; 250/311; 250/307
(58) Field of Classification Search ........... 250/306, 250/307, 309–311, 396 R
See application file for complete search history.

(56) References Cited

U.S. PATENT DOCUMENTS

| | | | |
|---|---|---|---|
| 4,853,545 A | 8/1989 | Rose | |
| 5,084,622 A | 1/1992 | Rose | |
| 5,221,844 A | 6/1993 | van der Mast et al. | |
| 5,798,524 A | 8/1998 | Kundmann et al. | |
| 5,814,815 A | 9/1998 | Matsumoto et al. | |
| 5,838,011 A | 11/1998 | Krijn et al. | |
| 5,986,269 A | 11/1999 | Krijn et al. | |
| 6,184,975 B1 | 2/2001 | Henstra et al. | |
| 6,191,423 B1 | 2/2001 | Krijn et al. | |
| 6,246,058 B1 | 6/2001 | Tiemeijer | |
| 6,329,659 B1 | 12/2001 | Krijn et al. | |
| 6,605,810 B1 | 8/2003 | Haider et al. | |
| 6,674,078 B2 | 1/2004 | Nagayama et al. | |
| 6,744,048 B2 | 6/2004 | Hosokawa et al. | |
| 7,378,667 B2 | 5/2008 | Henstra | |
| 7,777,185 B2 * | 8/2010 | de Jonge | 250/311 |
| 2002/0011566 A1 | 1/2002 | Nagayama et al. | |
| 2007/0284528 A1 | 12/2007 | Benner et al. | |
| 2008/0035854 A1 | 2/2008 | Jin et al. | |
| 2008/0202918 A1 | 8/2008 | Nagayama et al. | |
| 2008/0290264 A1 | 11/2008 | Henstra et al. | |

(Continued)

FOREIGN PATENT DOCUMENTS

WO  WO03032351  4/2003

(Continued)

OTHER PUBLICATIONS

Downing, Kenneth H. et al., "Discrimination of Heavy and Light Components in Electron Microscopy Using Single-Sideband Holographic Techniques," Optik, 1975, pp. 155-175, vol. 42, No. 2.

(Continued)

*Primary Examiner* — Bernard E Souw
(74) *Attorney, Agent, or Firm* — Scheinberg & Griner, LLP; David Griner; Michael O. Scheinberg

(57) ABSTRACT

The invention relates to a TEM with a corrector (330) to improve the image quality and a phase plate (340) to improve contrast. The improved TEM comprises a correction system completely placed between the objective lens and the phase plate, and uses the lenses of the corrector to form a magnified image of the diffraction plane on the phase plate.

26 Claims, 6 Drawing Sheets

U.S. PATENT DOCUMENTS

| | | | |
|---|---|---|---|
| 2009/0078868 A1* | 3/2009 | de Jonge | 250/310 |
| 2009/0168142 A1 | 7/2009 | Nagayama | |
| 2010/0051807 A1* | 3/2010 | Barton et al. | 250/311 |
| 2010/0065741 A1* | 3/2010 | Gerthsen et al. | 250/311 |

FOREIGN PATENT DOCUMENTS

| | | |
|---|---|---|
| WO | WO2006017252 | 2/2006 |
| WO | WO2007022862 | 3/2007 |

OTHER PUBLICATIONS

Spence, John C.H., "High-Resolution Electron Microscopy," 2004, pp. 61-88.

"Lens Abberations," 1 pg.

Gerthsen, D., et al, "Effect of a Physical Phase Plate on Contrast Transfer in an Aberration-Corrected Transmission Electron Microscope," Microscopy and Microanalysis, Jan. 1, 2007, pp. 126-127, vol. 13, Suppl. No. 2.

Wiederspahn, Markus, "Groundbreaking Development Project for Biotechnologies," Carl Zeiss Press Release, Feb. 23, 2007, 2 pages.

Boersch, H., "Uber die Moglichkeit der Abbildung von Atomen im Elektronenmikroskop," Z Naturforschung 2A, 1947, pp. 615-633.

Danev, Radostin, et al., "Transmission electron microscopy with Zemike phase plate," Ultramicroscopy 88, 2001, pp. 243-252.

Glaeser, R.M., et al., "Adapting the spatial-frequency band pass of in-focus phase-contrast apertures for biological applications,"Microsc Microanal, 2007, vol. 13, Suppl. 2, pp. 1214-1215.

Osakabe, Nobuyuki, et al., "Experimental confirmation of Aharonov-Bohm effect using a torodial magnetic field confined by a superconductor," Physical Review A, Aug. 1986, vol. 34, No. 2, 18 pages.

Reimer, Ludwig, "Transmission Electron Microscopy," 1984, p. 37.

* cited by examiner

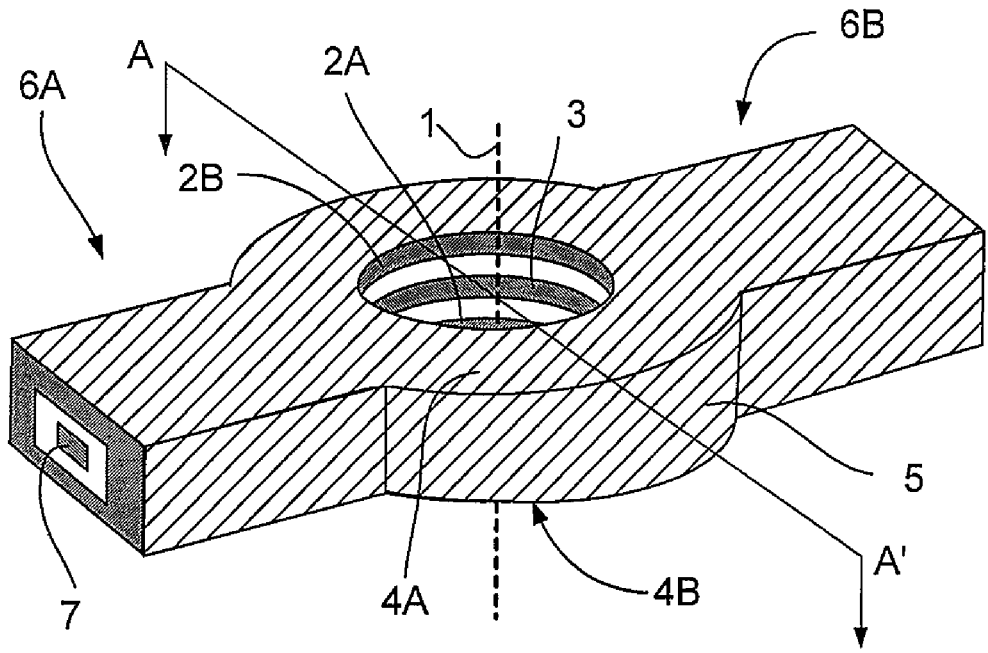
FIG. 1A (prior art phase plate)
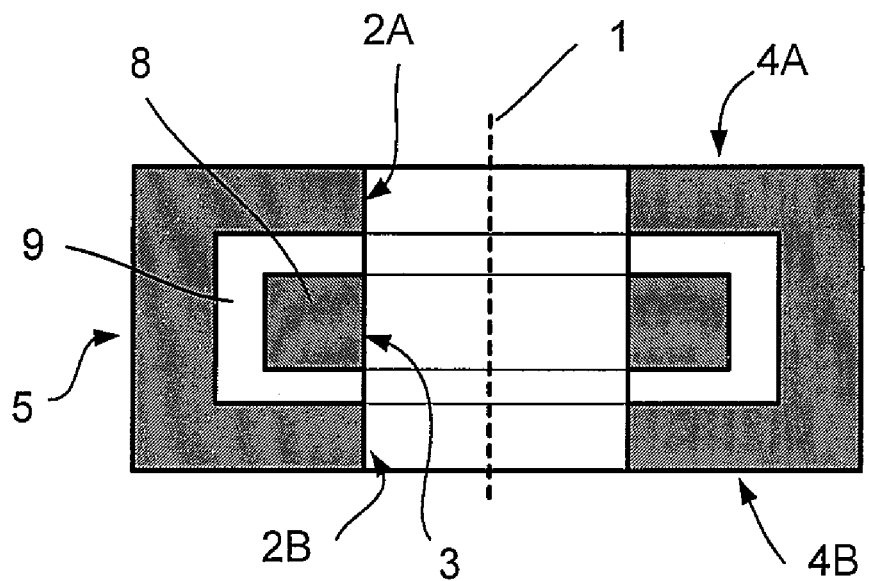
FIG. 1B (prior art phase plate)

Figure 3:
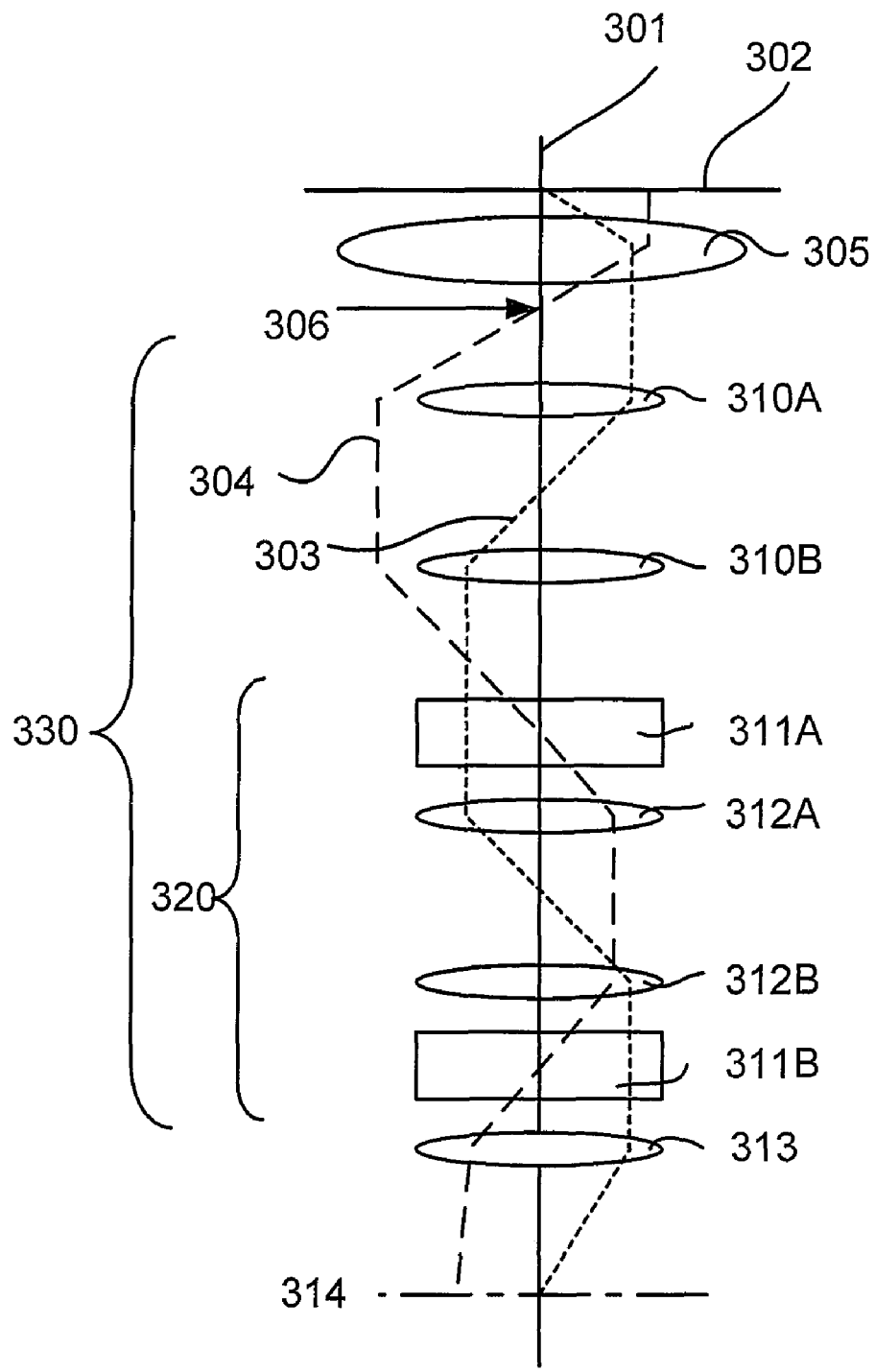

FIG. 3 (prior art correction system)

TEM WITH ABERRATION CORRECTOR AND PHASE PLATE

The invention relates to an apparatus for forming an image of a sample by irradiating the sample with a substantially parallel beam of particles and detecting particles transmitted through the sample, the apparatus comprising:
- a particle source for producing a beam of particles;
- a condenser system for forming a parallel beam;
- a sample holder for holding the sample at a sample position;
- an objective lens for forming a magnified image of the sample;
- a phase plate located in a plane where an unscattered part of the beam that passed through the sample forms a substantially round focus;
- a correction system for correcting aberrations of the objective lens; and
- a projection system for further magnifying the magnified image of the sample.

Such an apparatus is known from "Effect of a physical phase plate on contrast transfer in an aberration-corrected transmission electron microscope", D. Gerthsen et al., Microsc. Microanal. 13 (Suppl. 2) 2007, page 126-127.

In a Transmission Electron Microscope (TEM) a beam of electrons produced by an electron source is formed into a parallel beam of electrons illuminating the sample. The sample is very thin, so that part of the electrons pass through the sample and part of the electrons are absorbed in the sample. Some of the electrons are scattered in the sample so that they exit the sample under a different angle than under which they enter the sample, while others pass through the sample without scattering. By imaging the sample on a detector, such as a fluorescent screen or a CCD camera, intensity variations result in the image plane. The intensity fluctuations are in part due to the absorption of electrons in part of the sample, and in part to interference between scattered and unscattered electrons. The latter mechanism is especially important when observing samples in which little electrons are absorbed, e.g. low-Z materials such as biological tissues.

The contrast of the image resulting from electrons interfering with each other depends on the angle under which the electrons are scattered. Objects with a specific spatial frequency scatter the beam under a specific angle, the scattering angle being proportional to the spatial frequency. For low spatial frequencies the scattering angle is close to zero and the contrast is close to zero, for higher spatial frequencies the contrast fluctuates between a positive contrast and a negative contrast, depending on the spatial frequency. This is described by the so-named Contrast Transfer Function (CTF). As the CTF is close to zero for low spatial frequencies, large structure cannot be resolved in the image.

In 1947 Boersch described that the introduction of a phase plate would result in a CTF where low spatial frequencies show a maximum, and large structures can thus be imaged, see "Über die Kontraste von Atomen im Elektronenmikroskop", H. Boersch, Z. Naturforschung 2A (1947), p. 615-633. Recently such phase plates have successfully been introduced in TEM's.

A phase plate is a structure that is placed in a plane where the parallel beam illuminating the sample, after having passed through the sample, is focused. In this plane all unscattered electrons are focused in one point, while scattered electrons are imaged at other positions. The phase plate causes a phase shift between scattered and unscattered electrons of e.g. π/2, thereby converting the sine-like behaviour of the CTF to a cosine-like behaviour.

Such a phase shift can be caused by e.g. temporary accelerating or decelerating the unscattered electrons (a so-named Boersch phase plate), or by passing the scattered electrons through a thin foil of e.g. carbon (a so-named Zernike type phase plate, see "Transmission electron microscopy with Zernike phase plate", R. Danev et al., Ultramicroscopy 88 (2001), pages 243-252). Also a magnetic phase plate based on the Aharonov-Bohm effect is known (see "Experimental confirmation of Aharonov-Bohm effect using a toroidal magnetic field confined by a superconductor", N. Osakabe et al., Phys. Review A, Vol. 34 (1986) No 2, pages 815-822).

A Boersch phase plate must have a very small diameter for passing (most of the) scattered electrons without interception of these scattered electrons by the physical structure of the phase plate. The manufacturing of such a phase plate is described in e.g. U.S. Pat. No. 5,814,815 to Hitachi and in International Application WO2006/017252 to Glaeser.

A recent development in TEM's is the introduction of aberration correctors, correcting the aberration of the objective lens of such an apparatus and thereby improving the resolution of said TEM's.

Such a correction system is known from e.g. European patent EP1057204 B1 to CEOS Gmbh, Heidelberg Germany. TEM's with such a correction system are now commercially available, e.g. the Titan™ 80-300 of FEI Co., Hillsboro, USA.

Such a correction system is placed between the objective lens and the projection system of a TEM. The correction system comprises a transfer system in the form of a lens doublet, imaging the back-focal plane of the objective lens on a hexapole. Said hexapole is then imaged on another hexapole by a doublet of lenses, and finally an adaptor lens is used to form an image of the object for the projection system of the TEM.

It is noted that other correction systems are known, each with its own advantages and disadvantages. Differences may lay in the transfer system, the number and the type of multipoles (quadrupoles/octupoles versus hexapoles), the number of lenses between the multipoles, etc., as well as in the exact manner in which the principal rays pass through the correction system.

In the article of Gerthsen et al. it is proposed to combine an aberration correcting system with a phase plate inserted in the back-focal plane of the objective lens.

A problem when constructing an electron microscope with a phase plate in said back-focal plane of the objective lens is that this plane is very difficult to access: as the objective lens typically has a focal length of 1-5 mm, the back focal plane is physically located inside or close to the bore of one of the two pole pieces forming the objective lens.

Another reason why the back-focal plane of the objective lens may be difficult to access is that biological samples are often imaged in cryogenic conditions, that is: the sample is held at a cryogenic temperature close to that of boiling nitrogen or boiling helium. This is achieved by surrounding the sample position with cryo-shields, said cryo-shields held at a temperature close to or at said cryogenic temperature. The back-focal plane is typically only millimetres removed from the sample position, and therefore the cryogenic shields are also very close to or in the back-focal plane of the objective lens.

Even when the sample itself is not kept at a cryogenic temperature, anti-contamination shields are often used to prevent contamination near the sample. These anti-contamination shields are shields positioned in the vicinity of the sample and kept at liquid nitrogen temperature, i.e. very similar to before mentioned cryo-shields.

Still another reason why the back-focal plane is difficult to access is that such a phase plate must be well centred. This requires a centring mechanism, similar to the positioning mechanism known for TEM's for positioning apertures with respect to the beam. This positioning mechanism needs access to the back-focal plane, e.g. via a bore in the pole piece of the objective lens. As known to the person skilled in the art such a bore may disturb the symmetry of the objective lens and thereby deteriorate the quality of the lens. Also, for the positioning a mechanism on the outside of the microscope is needed, preferably including motors. Such a part may well mechanically interfere with other parts of the TEM that also need to be positioned at or near the sample plane, such as auxiliary detectors for detecting X-rays, secondary electrons, etc.

There is a need for an improved TEM with a phase plate and a correction system.

To that end an apparatus according to the invention is characterized in that at least part of the correction system is placed between the sample position and the phase plate, and said at least part of the correction system is equipped to image the back-focal plane of the objective lens on the plane of the phase plate.

In the article of Gerthsen the phase plate is placed in the back-focal plane of the objective lens. This implies that the phase plate is positioned between the objective lens and the correction system and thus shows the before mentioned disadvantages.

The invention is based on the insight that, by placing at least a part of the correction system between the objective lens and the phase plate, the phase plate can be placed in a more accessible plane and that optical elements of the correction system can be used to image the back-focal plane of the objective lens onto the phase plate. The phase plate is thus positioned in a plane removed from the back-focal plane of the objective lens, thereby avoiding the disadvantages mentioned before. This is achieved using optical elements of the correction system, thus avoiding addition of optical elements between the back-focal plane and the plane where the phase plate is placed, and therefore without the added complexity and added space introduced by such additional optical elements.

It is mentioned that the invention can be used with all of the before mentioned types of phase plates.

It is noted that an alternative method for making the plane where the phase plate resides more accessible is described in U.S. Pat. No. 6,744,048 to JEOL. In this patent standard transfer optics (in the form of a lens doublet) are used to make a 1:1 image of the back-focal plane of the objective lens at a different position which is more accessible.

A disadvantage of this alternative method is that the introduction of such transfer optics introduces an (additional) lens doublet between the objective lens and the aberration correcting system, resulting in added complexity.

Another disadvantage of the added doublet and the drift space between the lenses is the added height of the instrument. Aberration corrected TEM's already show a considerable height: the aberration corrected Titan™ 80-300 has a height in excess of 3.4 meters. The height requirements of the rooms in which such TEM's are located is recommended to be over 4 meters in height. As these rooms need good conditioning temperature conditioning, soundproofing and isolation from vibrations, the costs of these rooms may add considerably to the cost for installing these instruments. Further increasing the height of such instruments may lead to a further increase in these costs.

It is further noted that another such method is described in "Adapting the spatial-frequency band pass of in-focus phase-contrast apertures for biological applications", R. M. Glaeser et al., Microsc. Microanal. 13 (Suppl. 2) 2007, page 1214CD-1215CD. Here a relay lens between the objective lens and the phase plate is proposed to form an enlarged image of the back-focal plane. This article also suggests the use of aberration-correcting elements to improve a TEM equipped with phase plate. However, the article does not disclose how to combine a TEM, a phase plate and a correction system.

A disadvantage of this method is that the introduction of the relay lens adds to the complexity of the instrument. Another disadvantage of this method is that the added relay lens will also add to the height of the instrument, which is, as mentioned before, a disadvantage.

Another disadvantage of this method is that the relay lens itself also introduces aberrations, which may not be negligible when compared to the aberrations of the objective lens. Therefore, to obtain an aberration free image of the sample—or at least an image with reduced aberrations—, the aberrations of the relay lens should be corrected as well, adding to the demands of the correction system.

In an embodiment of the apparatus according to the invention the correction system corrects at least part of the spherical aberrations of the objective lens.

The correction system referred to in the before mentioned article of Gerthsen et al., and produced by CEOS Gmbh, Heidelberg, Germany, and incorporated in e.g. the Titan™ 80-300 of FEI Company, Hillsboro, USA, corrects the spherical aberration of the objective lens.

It is noted that TEM's are known in which not only spherical aberrations, but also chromatic aberrations are corrected.

In a preferred embodiment of the apparatus according to the invention the correction system is placed completely between the objective lens and the phase plate.

In this embodiment the complete correction system is placed between the objective lens and the phase plate.

It is noted that an additional correction system may be used for instruments capable of operating as a Scanning Transmission Electron Microscope (STEM), in which a finely focused beam is scanned over the sample. A correction system may be used to correct aberrations of the lens forming said finely focused beam.

It is further noted that an additional correction system may be used to minimize e.g. the effects of chromatic aberrations of the objective lens.

In another preferred embodiment of the apparatus according to the invention the phase plate is placed in a plane where a magnified image of the back-focal plane of the objective lens is formed.

An advantage of forming a magnified image of the back-focal plane of the objective lens is that the e.g. a Boersch phase plate intercepts, for a given diameter of the phase plate, less scattered electrons.

Another advantage is that the accuracy with which the phase plate must be centred is relieved.

Still another advantage for placing the phase plate in a magnified image of the back-focal plane of the objective lens is the resulting lower current density of the non-scattered beam.

It is noted that the phase plate must be centred round the focal point of the non-scattered beam. Said focal point shows a high current density and during centring of the phase plate the tiny structure of the phase plate may intercept the majority of this current, possibly resulting in overheating of (part of) the phase plate.

It is further noted that the relay lens proposed in the article of Glaeser may also form an enlarged image of the back-focal plane of the objective lens.

In a further embodiment of the apparatus according to the invention the magnification between the back-focal plane of the objective lens and the plane in which the phase plate is placed can be varied.

In the before mentioned article of Gerthsen et al. an image of a phase plate is shown in FIG. 1. It shows a central structure, the actual phase plate, with an outer diameter of approximately 3 µm, mounted in a surrounding aperture with an inner diameter of approximately 50 µm. The outer diameter of the actual phase plate causes the interception of electrons scattered under a small angle, introducing a cut-off for low spatial frequencies. The inner diameter of the surrounding aperture causes the interception of highly scattered electrons, and thus introduces a cut-off for high spatial frequencies.

By varying the magnification of the plane where the phase plate is located, the cut-off frequencies can be varied so as to meet the requirements for different applications.

In still a further embodiment of the apparatus according to the invention the correction system comprises a doublet, and the magnification between the back-focal plane and the plane where the phase plate is placed is varied by varying the magnification of the doublet.

By using the variable magnification of the doublet to vary the magnification between the back-focal plane of the objective lens and the plane where the phase plate resides, the magnification can be varied without adding extra optical parts.

In the CEOS correction system this can be done with the transfer doublet, transferring the back-focal plane to the first hexapole.

It is noted that, when changing said magnification, it may be necessary to change the excitation of e.g. the multipoles of the correction system In another embodiment the correction system comprises multipoles, and two lenses between said multipoles and the phase plate are used to vary the magnification.

By using a doublet of lenses between the multipoles and the phase plate it is possible to change the magnification from the back-focal plane to the plane of the phase plate without changing the excitation of the multipoles in the correction system.

In another embodiment of the apparatus according to the invention a lens is placed between the correction system and the projection system to image the sample at the entrance of the projection system.

This lens can be used to demagnify the image of the sample, so that the image formed by the combination of the objective lens, the correction system and said lens has a magnification equal to that of said objective lens alone. The advantage is that the projection system can then be identical to that of an instrument without corrector and phase plate.

It is noted that the phase plate may be positioned within the pole pieces of this lens.

It is further noted that this lens may contribute to the aberrations of the image of the sample. As known to the person skilled in the art, a lens with a large bore and a large gap may be used to minimize the aberrations of this lens. Using a lens with a large gap is particularly advantageous when positioning the phase plate between the pole pieces of this lens as this enables easy access of the positioning mechanism holding the phase plate.

It is mentioned that the correction system may also correct the aberrations of said lens.

In still another embodiment of the apparatus according to the invention the correction system further corrects at least partly the chromatic aberrations of the objective lens.

In yet another embodiment of the apparatus according to the invention the beam of particles is a beam of electrons.

In still another embodiment of the apparatus according to the invention the phase plate is retractably mounted.

Many TEM's are capable to operate as a Scanning Transmission Electron Microscopes (STEM). In a STEM the sample is scanned with a finely focused beam of electrons, and e.g. the amount of transmitted electrons is detected. A STEM has no need for a phase plate. The presence of a phase plate is even contra-productive, as it likely intercepts part of the transmitted electrons. By using a retractable phase plate, the phase plate can be retracted when using the apparatus in STEM mode and the phase plate can be inserted when using the apparatus in TEM mode.

Figure 2:
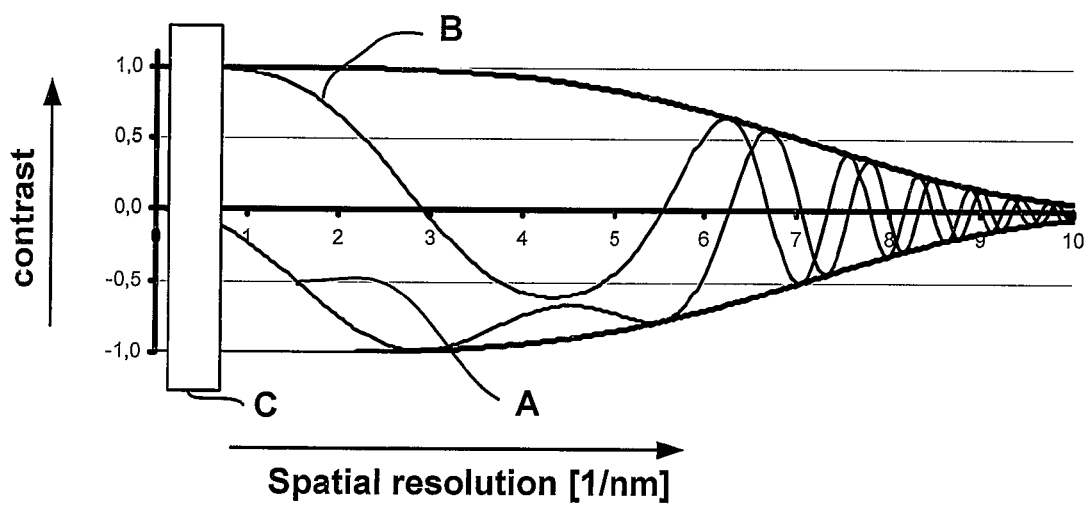
Figure 4:
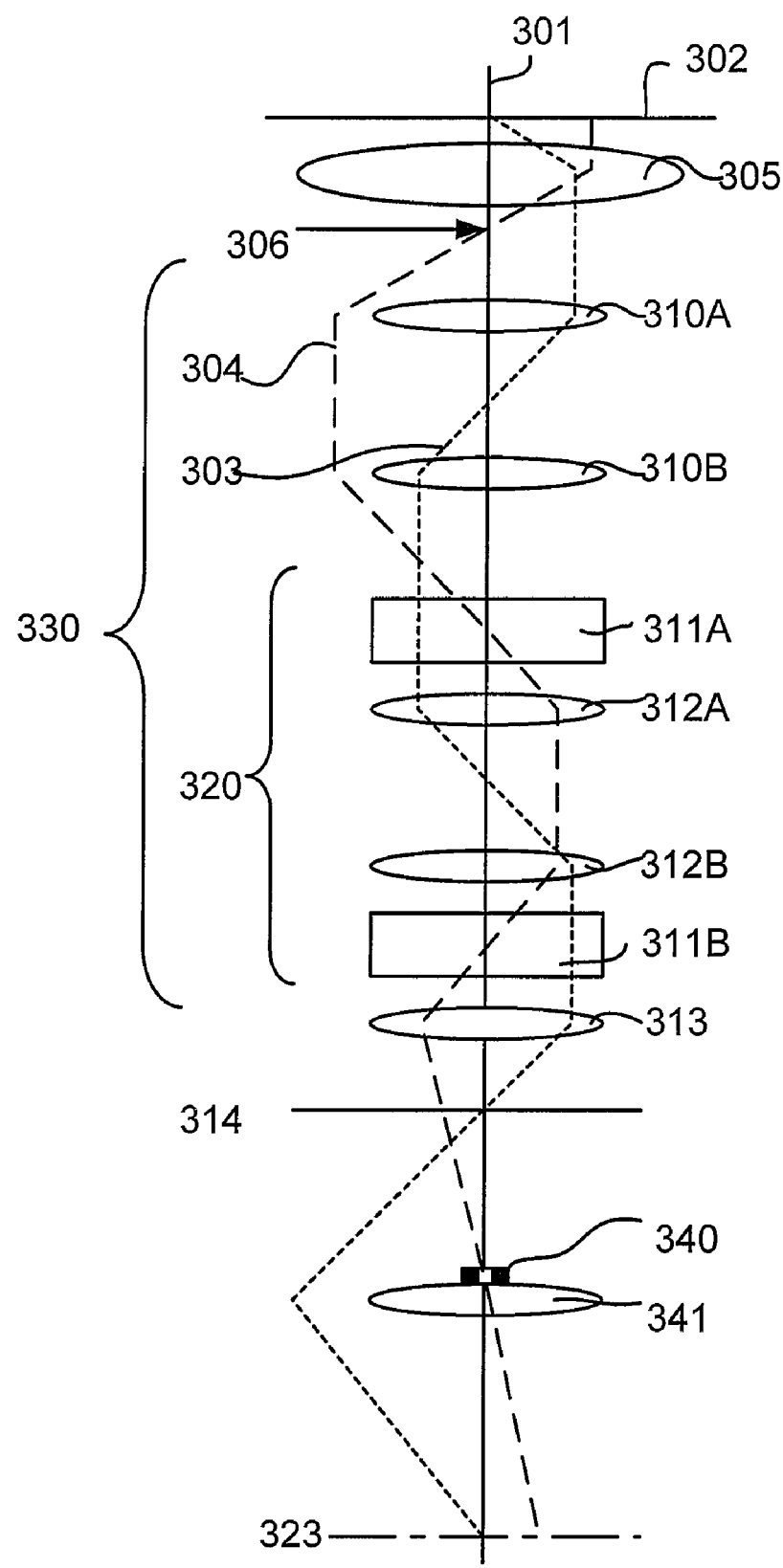
Figure 5:
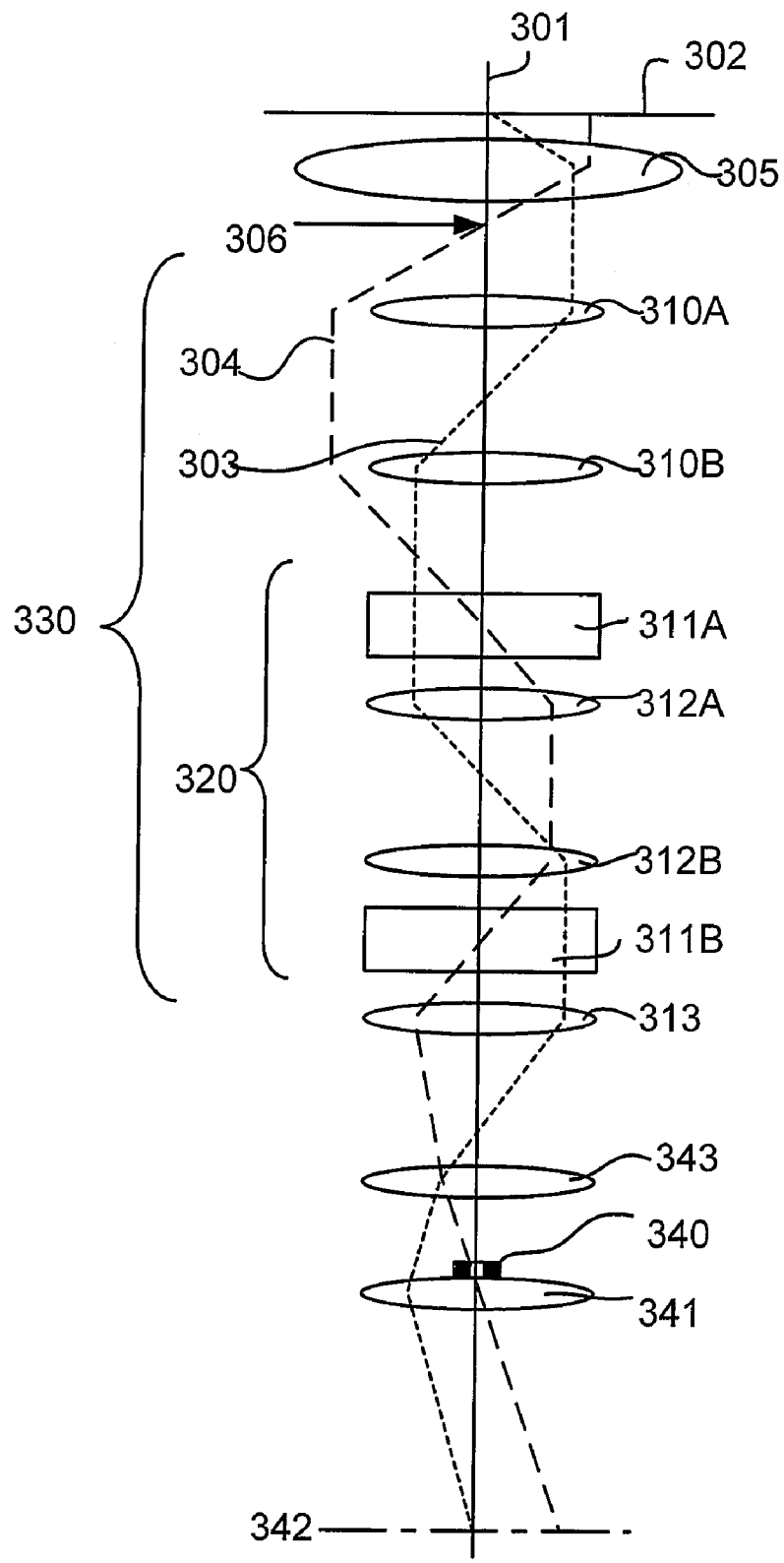
Figure 6:
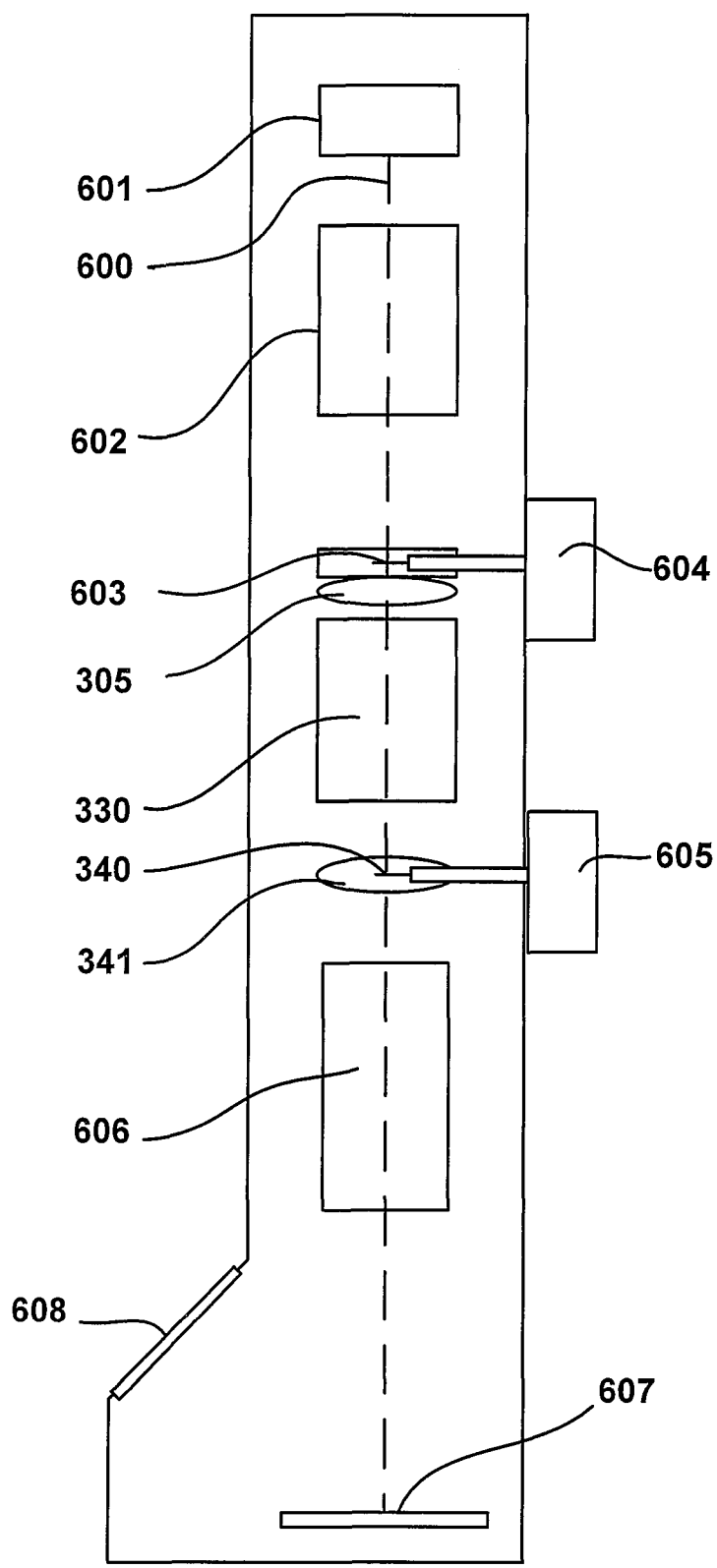

The invention is now elucidated with the help of figures, where identical numerals refer to corresponding features. To that end:

FIG. 1A and FIG. 1B schematically show a prior art Boersch phase plate;

FIG. 2 shows the contrast transfer function of a TEM without and with a phase plate;

FIG. 3 schematically shows a prior art correction system;

FIG. 4 schematically shows a preferred embodiment of the correction system and phase plate according to the invention;

FIG. 5 schematically shows the correction system and phase plate according to the invention with an added lens between correction system and phase plate; and FIG. 6 schematically shows a TEM according to the invention.

FIG. 1A and FIG. 1B schematically show a prior art Boersch phase plate as described in e.g. U.S. Pat. No. 5,814,815.

A central structure in the form of a cylinder is shown with a bore along its axis 1, the inside of the bore showing three ring-shaped electrodes 2A, 2B and 3 arranged round the axis of the cylinder. The middle electrode 3 is insulated from the two outer electrodes 2A and 2B, while the two outer electrodes are electrically connected to each other. The conductive outer surface comprising surfaces 4A, 4B and 5 of the cylinder is formed by a conductive surface, the outer electrodes 2A, 2B part of said conductive outer surface.

From the phase plate two or more spokes 6A, 6B extend to hold the phase plate. The outside of the spokes shows an electrically conductive layer connected to the conductive outer surface of the cylinder. At least one of the spokes shows an inner conductive track 7 insulated from the outer layer, the inner track electrically connected to the middle electrode 3.

By applying a voltage to the middle electrode electrons of the unscattered beam (passing through the bore) will travel slower or faster (depending on the voltage of the middle electrode) than electrons travelling outside the cylinder. This is equivalent to the unscattered part of the beam experiencing a phase shift with respect to the scattered part of the beam, as the scattered part of the beam is unaffected by the voltage of the middle electrode.

The conductive outer layer surrounds the cylinder so as to cause a uniform phase shift between the unscattered electrons and the scattered electrons, independent under which angle the scattered electrons are scattered, and thus how far removed the scattered electrons are from the cylinder. The conductive layer confines the effect of the middle electrode 3 to the unscattered beam, and prevents an electric field outside the cylinder due to the voltage on middle electrode 3.

FIG. 2 schematically shows the CTF of a TEM without and with a phase plate.

The CTF is the contrast transfer function, showing the contrast versus spatial resolution. As known to the person skilled in the art, for optimum contrast either a CTF of +1 or a CTF of −1 can be used. Structures in the sample with a spatial resolution where the CTF shows a 0 do not show contrast and are thus invisible.

Curve A shows the CTF for a microscope without a phase plate. The CTF shows a low contrast for low spatial resolutions.

Curve B shows the CTF of the TEM with a phase plate. Here the contrast shows an optimum at low spatial frequencies.

Block C represents the absence of signal below a spatial resolution due to the interception of electrons by the phase plate structure.

It is noted that the envelope of the CTF and the frequency with which the CTF oscillates around the horizontal axis is governed by microscope parameters such as the spherical aberration coefficient and the chromatical aberration coefficient of the objective lens, the defocus of the objective lens (that is: the distance between the sample plane and the object plane of the objective lens), etc.

FIG. 3 schematically shows a prior art correction system as described in U.S. Pat. No. 6,605,810 to CEOS Gmbh., Heidelberg, Germany. Such a correction system is commercially available and incorporated in e.g. the Titan™ 80-300 TEM of FEI Company, Hillsboro, USA.

The correction system is used to correct the aberrations of objective lens 305. A sample is positioned on the optical axis 301 in a sample plane 302 and imaged by an objective lens 305. The sample is placed in the front focal plane of the objective lens. Two principle rays are shown in this figure, a ray 303 coming under an angle from the centre of the sample and ray 304 coming from an off-axis point from the sample, parallel to the optical axis. Ray 304 intercepts the optical axis in the back-focal plane 306 of the objective lens. The correction system is arranged round the optical axis 301. A transfer doublet formed by lenses 310A, 310B images the back-focal plane on a first hexapole 311A. A doublet formed by lenses 312A, 312B images the first hexapole on a second hexapole 311B.

For a detailed description of the working of the corrector see U.S. Pat. No. 6,605,810, hereby incorporated by reference.

Not discussed in the patent, but included in the correction system, is an adapter lens 313 focusing ray 303 on the axis, thereby forming an image of the sample in plane 314. This image is used as object for the projection system (not shown) in the TEM so as to form a magnified image of the sample. Using this lens it is possible to make said magnification comparable to the magnification of an apparatus without a corrector system so that the projection system of a corrected TEM can be identical to the projection system of an uncorrected TEM.

It is noted that the objective lens 305 is here for convenience shown as a thin lens, with the sample plane 302 outside the lens itself. Most TEM's use as objective lens a thick lens, where the sample position is placed within the (magnetic) field of the objective lens.

It is also noted that the correction system not only corrects for aberrations of the objective lens, but also for the other lenses (310A, 310B, 312A, 312B, 313) of the correction system.

FIG. 4 schematically shows a preferred embodiment of the correction system and phase plate according to the invention.

In this embodiment the correction system 330, as described in FIG. 3, is placed completely between a phase plate 340 and the objective lens 305. The strength of adaptor lens 313 of the correction system is slightly changed so as to form an image of the back-focal plane of the objective lens on the phase plate.

In this preferred embodiment an additional adaptor lens 341 is added to form an image of the sample at plane 342, said plane acting as the object plane for the projection system. The additional adaptor lens is used to form an image of the object comparable in size with the image that is formed by the objective lens in a comparable apparatus without correction system and phase plate.

It is noted that the doublet formed by lenses 310A, 310B can be used to vary the magnification of the image of the back-focal plane at the phase plate. This, however, implies that the excitation of the multipoles 311A and 311B should also be changed. It is further remarked that the magnification can not be chosen arbitrarily. When the diameter of the beam in the multipoles of the correction system is small, a large excitation of the multipoles is needed, which may lead to e.g. dissipation problems (magnetic multipoles), flash-overs (electrostatic multipoles), etc. A large diameter of the beam however implies that the beam is close to the inner diameter of the multipoles, introducing aberrations resulting from e.g. the higher order multipole fields (an N-pole field with e.g. N>12) generated by the practical implementation of said hexapoles.

FIG. 5 schematically shows the correction system and phase plate according to the invention with an added lens between correction system and phase plate.

In this embodiment another method to vary the magnification of the back-focal plane on the plane of the phase plate is to use a doublet formed by lenses 313 and 343. In this case the principal ray through the correction system are not changed when changing said magnification, and thus the excitation of the correction system need not be changed when varying said magnification.

FIG. 6 schematically shows a TEM according to the invention.

FIG. 6 shows a particle source 601 producing a beam of particles, such as electrons, along optical axis 600. The particles have a typical energy of 80-300 keV, although higher energies, e.g. 400 keV-1 MeV, or lower energies, e.g. 30 keV, may be used. The beam of particles is manipulated by condenser system 602 to form a parallel beam impinging on a sample 603, the sample positioned with a sample holder 604. The sample holder can position the sample with respect to the optical axis and may shift the sample in the plane perpendicular to the optical axis and tilt the sample with respect to said axis. Objective lens 305 forms a magnified image of the sample. The objective is followed by a correction system 330, e.g. the correction system as previously shown in FIG. 4. An adaptor lens 341 and a phase plate 340 are placed in a plane conjugated to the back-focal plane of the objective lens, said conjugated plane positioned between the correction system and a projection system 606. The phase plate is positioned with a manipulator 605, allowing the phase plate to be centred round the optical axis. The projection system forms a magnified image of the sample on a detector 607, thereby revealing sample details of e.g. 0.05 nm. The detector may take the form of a fluorescent screen, or e.g. a CCD camera. In the case of e.g. a fluorescent screen the screen can be viewed via the glass window 608.

We claim as follows:

1. An apparatus for forming an image of a sample by irradiating the sample with a substantially parallel beam of particles and detecting particles transmitted through the sample, the apparatus comprising:
   a particle source for producing a beam of particles, a condenser system for forming a parallel beam, a sample holder for holding the sample at a sample position, an objective lens for forming a magnified image of the sample, a phase plate located in a plane where an unscattered part of the beam that passed through the sample forms a substantially round focus, a correction system for correcting aberrations of the objective lens, and a projection system for further magnifying the magnified image of the sample, characterized in that at least part of the correction system is placed between the sample position and the phase plate, and said at least part of the correction system is equipped to image the back-focal plane of the objective lens on the plane of the phase plate.

2. The apparatus according to claim 1 in which the correction system corrects at least part of the spherical aberration of the objective lens.

3. The apparatus according to claim 1 in which the correction system is completely placed between the sample position and the phase plate.

4. The apparatus according to claim 1 in which the phase plate is placed in a plane where a magnified image of the back-focal plane of the objective lens is formed.

5. The apparatus according to claim 4 in which the magnification between the back-focal plane of the objective lens and the plane in which the phase plate is placed can be varied.

6. The apparatus according to claim 5 in which the correction system comprises a doublet, and the magnification between the back-focal plane and the plane where the phase plate is placed is varied by varying the magnification of the doublet.

7. The apparatus according to claim 5 in which the correction system comprises multipoles, and two lenses between said multipoles and the phase plate are used to vary said magnification.

8. The apparatus according to claim 1 in which between the correction system and the projection system a lens is placed to image the sample at the entrance of the projection system.

9. The apparatus according to claim 1 in which the correction system further corrects at least partly the chromatic aberrations of the objective lens.

10. The apparatus according to claim 1 in which the beam of particles is a beam of electrons.

11. The apparatus according to claim 1 in which the phase plate is retractably mounted.

12. A method of forming an image of a sample by irradiating the sample with a particle beam and detecting particles transmitted through the sample, the method comprising:

producing particles from a particle source;

forming a parallel beam of the particles;

passing the parallel beam of particles through a sample;

forming, using an objective lens having a back focal plane, a first magnified image of the sample;

correcting the beam for aberration of the objective lens using a correction system;

forming using a projection lens a second magnified image from the first magnified image; and passing a first portion of the beam through a phase plate to shift the phase of the first portion of the beam relative to a second portion of the beam, in which at least part of the correction system is positioned between the sample position and the phase plate, and at least part of the correction system is configured to image the back-focal plane of the objective lens onto the plane of a phase plate.

13. The method of claim 12 in which correcting the beam for aberrations of the objective lens includes correcting at least part of the spherical aberration of the objective lens.

14. The method of claim 12 in which the correction system is positioned entirely between the sample position and the phase plate.

15. The method of claim 12 in which the phase plate is positioned in a plane where a magnified image of the back-focal plane of the objective lens is formed.

16. The method of claim 12 further comprising varying the magnification of the second magnified image.

17. The method of claim 16 in which correcting the beam for aberration includes passing the beam through a doublet, and varying the magnification of the second magnified image includes varying the magnification of the doublet.

18. The method of claim 16 in which correcting the beam for aberration includes passing the beam through one or more multipoles, and in which varying the magnification of the second magnified image includes varying the magnification of two lenses positioned between the one or more multipoles and the phase plate.

19. The method of claim 12 further comprising passing the beam through a lens between the correction system and the projection lens to form an image of the sample at the entrance of the projection system.

20. The method of claim 12 in which correcting the beam for aberration includes correcting at least partly the chromatic aberrations of the objective lens.

21. The method of claim 12 in which producing particles from a particle source includes producing electrons and in which forming a parallel beam of the particles includes forming an electron beam.

22. The method of claim 12 further comprising retracting the phase plate to allow changing the operation of a particle optical apparatus without having to remove the phase plate.

23. A method of forming an image of a sample by irradiating the sample with a substantially parallel beam of particles and detecting particles transmitted through the sample, the apparatus comprising:

providing a particle source for producing a beam of particles, providing a condenser system for forming a parallel beam, providing a sample holder for holding the sample at a sample position, providing an objective lens for forming a magnified image of the sample, providing a phase plate located in a plane where an unscattered part of the beam that passed through the sample forms a substantially round focus, providing a correction system for correcting aberrations of the objective lens, providing a projection system for further magnifying the magnified image of the sample, and forming an image of a sample by irradiating the sample with a substantially parallel beam of particles from the condenser system and passing the beam from the sample through the objective lens, the phase plate, the correction system, and the projection system;

in which:

at least part of the correction system is placed between the sample position and the phase plate, and said at least part of the correction system is equipped to image the back-focal plane of the objective lens on the plane of the phase plate.

24. The method of claim 23 in which providing a correction system includes providing the correction system positioned entirely between the sample position and the phase plate.

25. The method of claim 23 in which providing the phase plate includes positioning the phase plate in a plane where a magnified image of the back-focal plane of the objective lens is formed.

26. The method of claim 25 in which forming an image of a sample comprises varying the magnification between the back-focal plane of the objective lens and the plane in which the phase plate is placed.

* * * * *